United States Patent [19]
Delagebeaudeuf

[11] 4,176,366
[45] Nov. 27, 1979

[54] AVALANCHE TRANSIT TIME DIODE WITH HETEROJUNCTION STRUCTURE

[75] Inventor: Daniel Delagebeaudeuf, Paris, France

[73] Assignee: Thomson-CSF, Paris, France

[21] Appl. No.: 871,881

[22] Filed: Jan. 24, 1978

[30] Foreign Application Priority Data

Jan. 28, 1977 [FR] France ............... 77 02454

[51] Int. Cl.² .............. H01L 29/267; H01L 29/90; H03B 9/12
[52] U.S. Cl. ............... 357/16; 331/107 R; 357/13
[58] Field of Search ............ 357/13, 16; 331/107 R

[56] References Cited

U.S. PATENT DOCUMENTS

| | | | |
|---|---|---|---|
| 3,466,512 | 9/1969 | Seidel | 357/16 |
| 4,119,994 | 10/1978 | Jain et al. | 357/16 |

*Primary Examiner*—William D. Larkins

*Attorney, Agent, or Firm*—Cushman, Darby & Cushman

[57] ABSTRACT

An avalanche diode of the IMPact Avalanche Transit Time (IMPATT) type with heterojunction structure of two different semiconductor materials, wherein a semiconductor junction P/N or N/P is located at the interface of the two materials. In order to improve the efficiency of the diode functioning as an oscillator, the impurity concentrations of the semiconductors are chosen so that the avalanche zone is located in one and only one of the materials, the thickness of the materials being determined in conjunction with the impurity concentrations to have transit zones of equal length, thus producing a "double drift" avalanche zone. In the case of Ge/Ga As the condition to be fulfilled by the impurity concentration $K_1$ of Ge and the impurity concentration $K_2$ of Ga AS is very simple:

$$K_1 = \tfrac{8}{3} K_2$$

4 Claims, 2 Drawing Figures

AVALANCHE TRANSIT TIME DIODE WITH HETEROJUNCTION STRUCTURE

This invention relates to an avalanche diode with heterojunction structure intended to oscillate in the so-called "transit time" mode. The generation of very high frequency electromagnetic waves in a diode such as this is of the impact avalanche transit time (IMPATT) type combining the phenomenon of impact ionisation and the use of the transit time of the charge carriers.

The theory behind the operation of these diodes shows the important role played by the ratio between the voltage drop in the avalanche zone and the global voltage on breakdown in regard to the power efficiency of the diode which is also known as the conversion efficiency.

According to the most elementary theory, the efficiency would be proportional to the quantity:

$$1-(VA/VO)$$

where VA is the voltage in the avalanche zone and VO is the global voltage on breakdown.

Accordingly, diodes which, by virtue of their more or less complex doping profile, have a low VA/VO ratio and hence a high theoretical efficiency have been proposed as being capable of high efficiency levels. This is the case with diodes having "high-low" and "low-high-low" doping profiles.

The following Table shows the efficiency obtained and an estimation of the quantity $1-(VA/VO)$ for some typical structures:

| Type of structure | Efficiency | (1-VA/VO) estimated |
|---|---|---|
| $P^+NN^+$ of silicon | 8 to 10% | 0.4 |
| $P^+NN^+$ of silicon | 14 to 15% | 0.6 |
| $P^+NN^+$ of germanium | 12% | 0.5 |
| metal-N-$N^+$ of Ga As | 15% | 0.6 |
| "high-low" of Ga As | 20 to 26% | 0.7 |
| "low-high-low" of Ga As | 25 to 36% | 0.7 to 0.8 |

It can be seen from the Table that, although the strict proportionality of the efficiency to the quantity $(1-VA/VO)$ is questionable, it is obvious that the efficiency is high when this quantity is very close to 1.

If the role of certain characteristic parameters of the semi-conductor material is revealed, it can easily be seen that the efficiency is higher, all conditions otherwise being equal, in the case of germanium or gallium arsenide than in the case of silicon due to the greater mobility of the charge carriers in the first case. This is because a reduction in the losses attributable to the circulation of charges in the non-depleted zones is associated with a greater degree of mobility.

The structure of the last two lines of the Table are the most favourable in regard to efficiency but also the most difficult to obtain with good reproducibility on an industrial scale.

In the present invention, one obviates this disadvantage by using a junction P/N or N/P between two semi-conductor materials of which each is uniformly doped and hence easy to produce whilst, at the same time, showing relatively high efficiency in the "IMPATT" mode.

In accordance with the invention, there is provided an avalanche transit time diode with heterojunction structure grouping a first and a second semiconductor materials, comprising two zones of opposite impurity type conductivities, the first zone being made of said first material and the second zone being made of said second material, the impurity concentrations $K_1$ and $K_2$ of the respective first and second zones being bound by the relation:

$$K_2 > 6.3 \; 10^{-6}(K_1)^{1.3}$$

with the result that the avalanche zone can be located in the first zone.

The invention will be better understood and other features thereof will become apparent from the following description of examples in conjunction with the accompanying drawings, wherein.

The possibility of forming almost perfect semiconducting heterojunctions between two monocrystalline phases having opposite conductivity types has been demonstrated in the laboratory.

In particular, junctions have been formed between germanium and gallium arsenide, for example by growing germanium on a substrate of monocrystalline gallium arsenide. A monocrystalline growth such as this is possible because the meshes of the crystal lattice of Ge and Ga As are very similar to one another in their dimensions. In addition, the junction thus formed is far from fragile because the coefficients of expansion as a function of temperature of these two substances are very similar.

Figure 1:
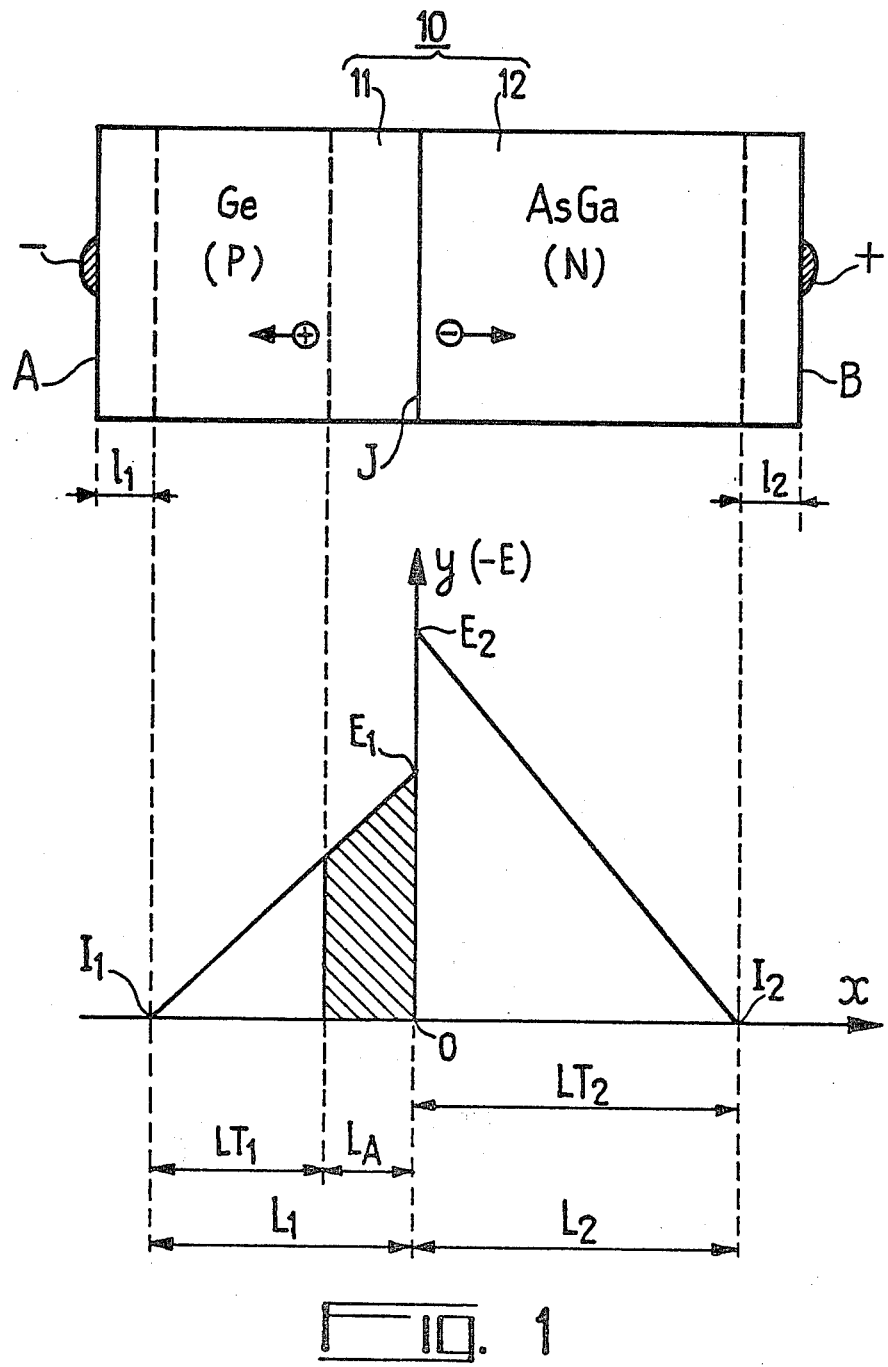
FIG. 1 is a section through a diode according to the invention with an electrical field map associated with this section.

In the example described, there is shown in FIG. 1, in a section taken perpendicularly of the planar junction surface, a semi-conductor block consisting of two unequal portions situated on either side of the junction and respectively formed by P-doped monocrystalline germanium (part 11) and N-doped gallium arsenide (part 12). The block is for example a rectangular parallelepiped having two planar surfaces A(Ge side) and B(Ga As side) parallel to the junction surface J. Ohmic contacts (+ and −) formed on the surfaces A and B respectively provide for the application of a d.c. biassing voltage and for collection of the high frequency generated by the diode when it functions as an oscillator.

FIG. 1 also shows the map of the electrical field in the semi-conductor medium in the form of a diagram with two rectangular axes Ox and Oy, the axis Ox being oriented in the direction AB perpendicularly of the junction surface with the origin O on the plane J, and the axis Oy being oriented on the side of the negative electrical fields E. Since the junction is biassed in the backward direction, as indicated by the symbols + and − of the contacts, the diagram is as follows wherein breakdown conditions are fulfilled. On either side of the axis Oy, there are two right-angled triangles $I_1OE_1$ and $I_2OE_2$ of which the sides of the right angle along Oy have lengths representing the electrical fields $E_1$ and $E_2$ resulting from the application of Poisson's law to the two depleted zones created in the media 11 and 12 having permittivities $\epsilon_1$ and $\epsilon_2$. Accordingly:

$$\epsilon_1 E_1 = \epsilon_2 E_2 \qquad (1)$$

In the case of geranium and gallium arsenide, $E_2$ has substantially the following value:

$$E_2 = 1.5 E_1 \tag{2}$$

The sides $OI_1$ and $OI_2$ of the triangles represent the lengths of the two depleted zones. The total surface areas of the two triangles represent the potential difference applied between the contacts + and −, the voltage drops in the extreme parts of the block (lengths $l_1$ and $l_2$) being negligible at least at low currents.

According to one of the principal features of the invention, the impact ionisation and the actual avalanche occurs solely in the germanium in a region of thickness $L_1$ bordered by the plane J, if certain conditions are fulfilled.

If $K_1$ and $K_2$ are the impurity concentrations in number of atoms per cubic centimeter of semi-conductor material, respectively in the parts 11 (Ge) and 12 (Ga As), there should be a minimal concentration $K_2$ for a given concentration $K_1$ of approximately:

$$(K_2)\ \text{minimal} = 6.3 \cdot 10^{-6}(K_1)^{1.3} \tag{3}$$

This formula is empirically deduced from the experimental graphs of S.M. Sze giving the critical fields in dependance upon the impurity concentration in germanium and Ga As.

Figure 2:
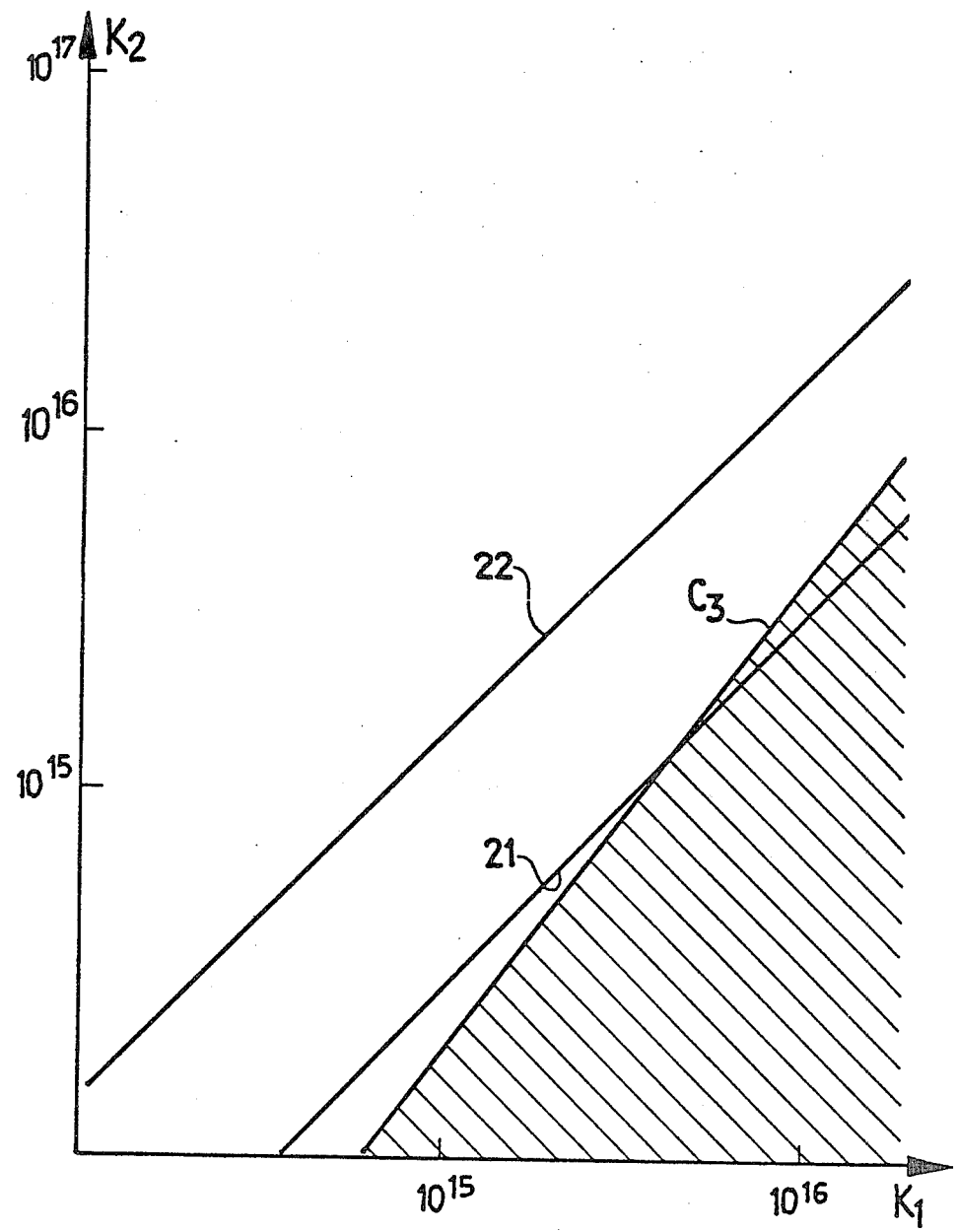
FIG. 2 is an explanatory diagram.

In the diagram of FIG. 2, the powers of 10 of the concentration $K_1$ are recorded as logarithmic abscissae and the powers of 10 of the concentration $k_2$ as ordinates, the starting values both for $K_1$ and for $K_2$ being of the order of $10^{14}$ at/cc. The hatched area represents the region situated outside the region characteristic of the invention, this region being limited by the curve $C_3$ translating the equation (3).

On the same graph, the straight lines 21 and 22 represent two typical cases which may be envisaged. On the straight line 21, the concentrations are such that, depending upon the properties of the heterojunction (see below):

$$LT_2 >> LT_1 \tag{4}$$

the transit lengths $LT_1$ and $LT_2$ being defined as follows, FIG. 1 (b):

$$LT_1 = OI_1 - L_A \tag{5}$$

$$LT_2 = OI_2 \tag{6}$$

In the case of the straight line 22:

$$LT_1 = LT_2 \tag{7}$$

When the condition (4) is fulfilled in such a way that $LT_1$ is negligible by comparison with $LT_2$, the diode is said to be of the single "drift" type. This is approximately the case on the straight line 21 which, for the most part, is situated outside the region characteristic of the invention. As a consequence, this case gives rise to difficulties.

When the condition (7) is fulfilled, the diode is said to be of the double "drift" type. This is the case on the straight line 22 which can be seen to be entirely situated within the region characteristic of the invention.

The efficiency of the diodes according to the invention is greater, the shorter the lengths $l_1$, $l_2$ and $L_A$, the dimensions of the transit zones being dictated by the wavelength of the oscillation to be generated.

The lengths $l_1$ and $l_2$ may be freely reduced.

With regard to the length $L_A$ directly proportional to the quantity VA which it is desired to reduce, the following approximation may be made:

$$L_A = (OI_1/3) = (L_1/3) \tag{8}$$

Accordingly, it follows from FIG. 1 that:

$$L_1 = 1.5 LT_1 \tag{9}$$

Now, in the absence of interfacial surface charges in the plane J, the following equilibrium equation applies to the electrical charges before impact ionisation:

$$K_1 L_1 = K_2 L_2 \tag{10}$$

from which it follows, taking relation (9) into account, that:

$$(K_2 LT_2 / K_1 LT_1) = 1.5 \tag{11}$$

and, in the case of the relation (7):

$$K_2 = 1.5 K_1 \tag{12}$$

If, for example, it is desired to produce a double drift diode according to the invention oscillating at 15 Gc/s, the transit lengths required on breakdown are as follows:

$$LT_1 = LT_2 = 2.2\ \text{microns}.$$

This condition is fulfilled for the following respective impurity concentrations of the two materials:

$$K_1 = 5 \cdot 10^{15}\ \text{At/cc}$$

$$K_2 = 8 \cdot 10^{15}\ \text{At/cc (theoretically 7.5}\ 10^{15})$$

For this value of $K_1$, the critical field in germanium is approximately 200 KV/cm.

From this it follows that:
(1) the breakdown voltage Vo is of the order of 70 volts,
(2) the quantity $(1 - VA/VO)$ is of the order of 0.74.

What I claim is:

1. An avalanche transit time diode with heterojunction structure comprising a first zone made of monocrystalline germanium doped in one type of conductivity and a second zone made of gallium arsenide doped in the opposite type of conductivity, the impurity concentrations in atoms per cubic centimeter $K_1$ and $K_2$ of the respective first and second zones being bound by the relationship:

$$K_2 > 6.3 \times 10^{-6} (K_1)^{1.3},$$

where $$K_2 \geq K_1$$

with the result that the avalanche zone is located in the first zone.

2. A diode as claimed in claim 1, wherein the first zone is of the p type of conductivity and the gallium arsenide of the n type.

3. An avalanche transit time diode with heterojunction structure comprising a first zone made of monocrystalline germanium doped in one type of conductivity and a second zone made of gallium arsenide doped in the opposite type of conductivity, the impurity concentrations in atoms per cubic centimeter $K_1$ and $K_2$ of the respective first and second zones fulfilling the relationship:

$$K_2 = 1.5 K_1$$

with the result that the avalanche zone is located in the first zone.

4. A diode as claimed in claim 3, wherein $K_1 = 5 \times 10^{15}$.

* * * * *